(12) United States Patent
Kobune

(10) Patent No.: US 12,315,702 B2
(45) Date of Patent: May 27, 2025

(54) PLASMA PROCESSING APPARATUS

(71) Applicant: Tokyo Electron Limited, Tokyo (JP)

(72) Inventor: Takaki Kobune, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 473 days.

(21) Appl. No.: 17/510,704

(22) Filed: Oct. 26, 2021

(65) Prior Publication Data

US 2022/0130645 A1 Apr. 28, 2022

(30) Foreign Application Priority Data

Oct. 27, 2020 (JP) ................. 2020-179743

(51) Int. Cl.
*H01J 37/32* (2006.01)

(52) U.S. Cl.
CPC .. *H01J 37/32522* (2013.01); *H01J 37/32513* (2013.01); *H01J 37/32651* (2013.01)

(58) Field of Classification Search
CPC ............ C23C 16/4411; H01J 37/32513; H01J 37/32522; H01J 37/32651; H01L 21/67109
See application file for complete search history.

(56) References Cited

U.S. PATENT DOCUMENTS

| | | | | | |
|---|---|---|---|---|---|
| 2002/0185068 | A1* | 12/2002 | Gurary | ............ | H01L 29/78654 118/722 |
| 2004/0149214 | A1* | 8/2004 | Hirose | ............ | H01L 21/67126 118/715 |
| 2009/0111276 | A1* | 4/2009 | Dhindsa | ............ | G05D 23/192 700/121 |
| 2015/0129129 | A1* | 5/2015 | Shimizu | ............ | C23C 16/4401 156/345.3 |
| 2015/0187542 | A1* | 7/2015 | Ishida | ............ | H01J 37/32495 156/345.1 |

FOREIGN PATENT DOCUMENTS

| | | | | |
|---|---|---|---|---|
| JP | 2001319886 A | * | 11/2001 | ............ C30B 25/10 |
| JP | 2013535099 A | | 9/2013 | |
| JP | 2015-126197 A | | 7/2015 | |
| JP | 2019537267 A | | 12/2019 | |
| JP | 202047707 A | | 3/2020 | |
| TW | 202017040 A | | 5/2020 | |

* cited by examiner

*Primary Examiner* — Benjamin Kendall
(74) *Attorney, Agent, or Firm* — Nath, Goldberg & Meyer; Jerald L. Meyer; Tanya E. Harkins

(57) ABSTRACT

A plasma processing apparatus includes a cylindrical chamber defining a processing space in which a substrate is processed, and a member constituting an outer circumference of the cylindrical chamber. The member includes at least one flow path inlet configured to allow a heat transfer medium to flow in therethrough, at least one flow path outlet configured to allow the heat transfer medium to flow out therethrough, at least one flow path connecting the flow path inlet and the flow path outlet to one another to allow the heat transfer medium to flow therethrough, and at least one folded-back portion formed in the flow path. The flow path inlet and the flow path outlet are located close to each other, and the flow path is formed at a specific angle in a circumferential direction of the member.

10 Claims, 10 Drawing Sheets

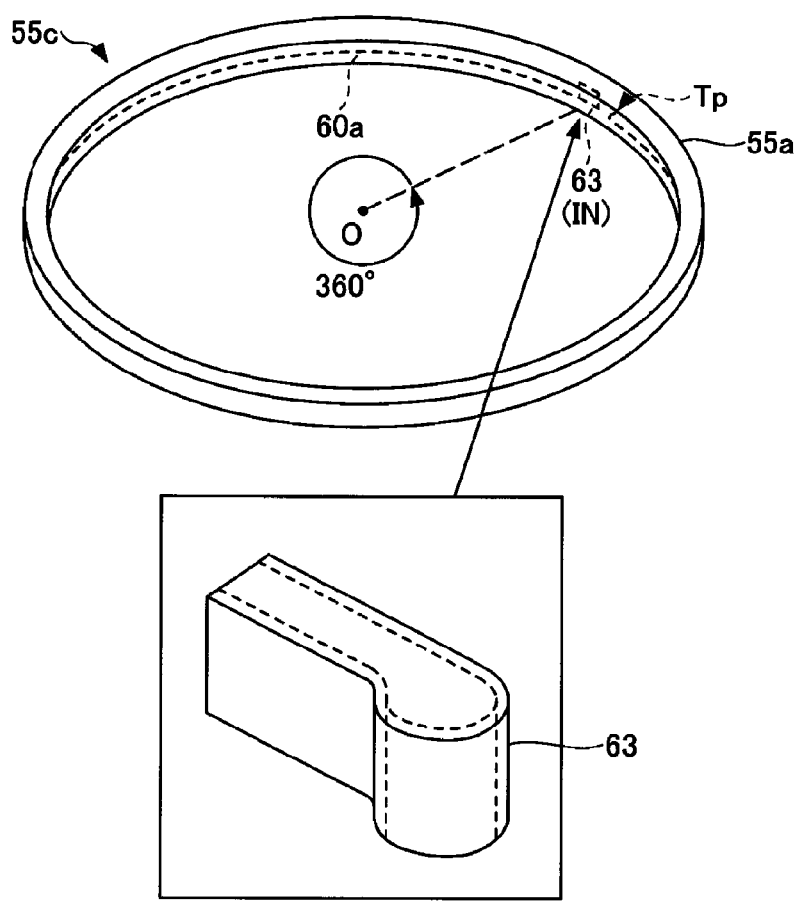

FIG. 6C

| | |
|---|---|
| | ![diagram with labels 55c, 60b, 60a, Tp, IN, OUT] |
| Without insulating material | Δ6.0 ℃ |
| With insulating material | Δ5.9 ℃ |

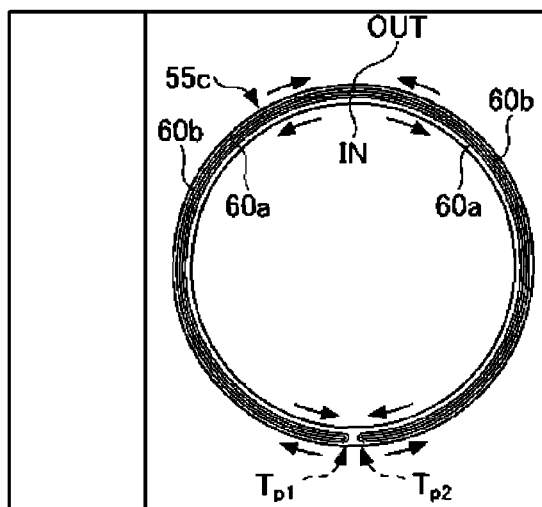

PLASMA PROCESSING APPARATUS

CROSS-REFERENCE TO RELATED APPLICATION

This application is based upon and claims the benefit of priority from Japanese Patent Application No. 2020-179743, filed on Oct. 27, 2020, the entire contents of which are incorporated herein by reference.

TECHNICAL FIELD

The present disclosure relates to a plasma processing apparatus.

BACKGROUND

For example, Patent Document 1 proposes a plasma processing apparatus including a cylindrical chamber having an opening configured to carry in a substrate therethrough, and a shutter arranged along the inner wall of the chamber and configured to open and close the opening at a position corresponding to the opening.

PRIOR ART DOCUMENT

Patent Document

Patent Document 1: Japanese Laid-Open Patent Publication No. 2015-126197

SUMMARY

According to the embodiments of the present disclosure, there is provided a plasma processing apparatus includes a cylindrical chamber defining a processing space in which a substrate is processed, and a member constituting an outer circumference of the cylindrical chamber. The member includes at least one flow path inlet configured to allow a heat transfer medium to flow in therethrough, at least one flow path outlet configured to allow the heat transfer medium to flow out therethrough, at least one flow path connecting the flow path inlet and the flow path outlet to one another to allow the heat transfer medium to flow therethrough, and at least one folded-back portion formed in the flow path. The flow path inlet and the flow path outlet are located close to each other, and the flow path is formed at a specific angle in a circumferential direction of the member.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 5A and 5B are views illustrating another example of the flow path structure of the shutter member according to the embodiment.

FIGS. 6A to 6D are views illustrating examples of measurement results of the temperature of the shutter member according to the embodiment.

DETAILED DESCRIPTION

Figure 1:
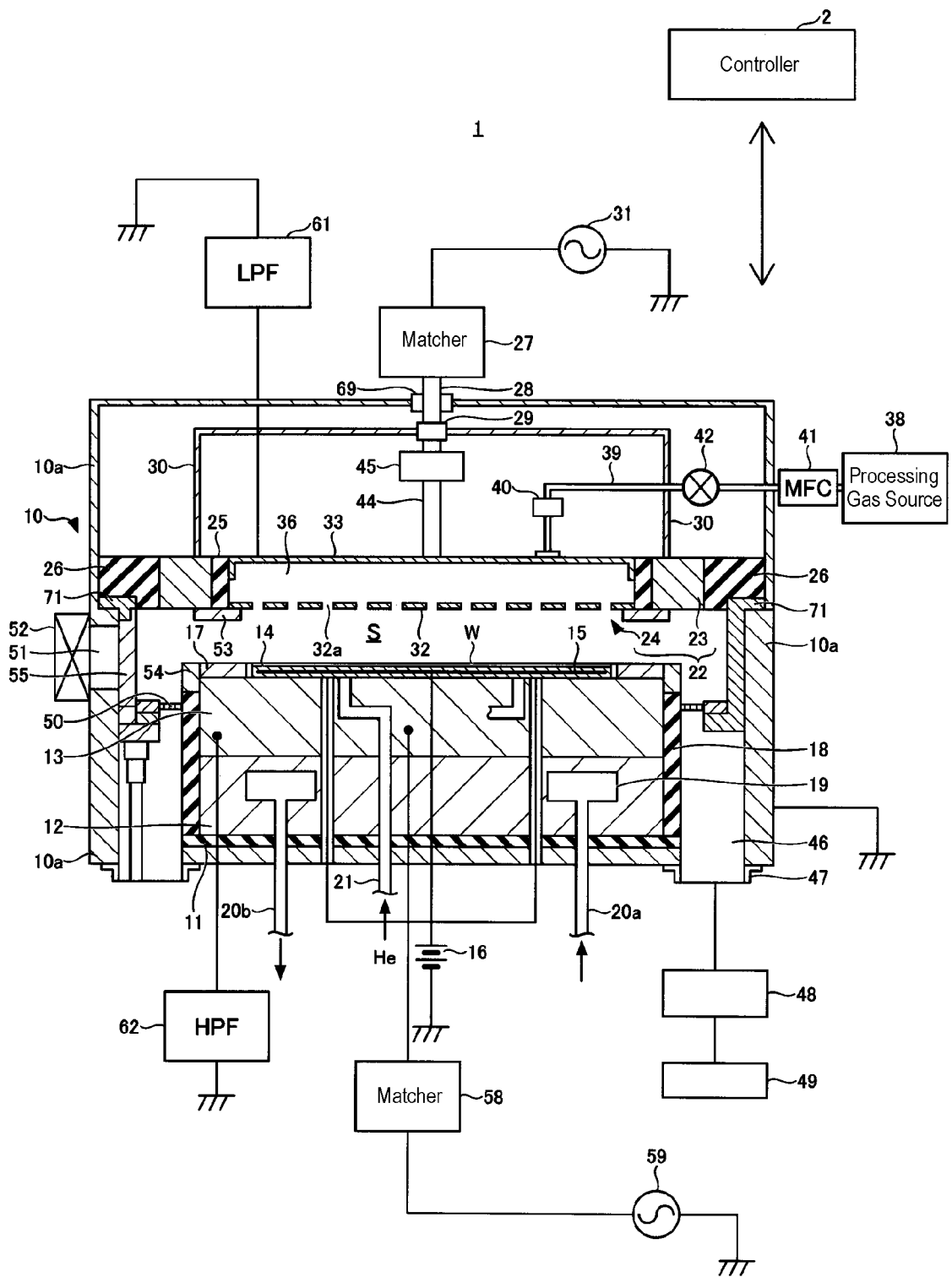
FIG. 1 is a schematic cross-sectional view illustrating an example of a plasma processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the accompanying drawings. In each of the drawings, the same components are denoted by the same reference numerals, and redundant descriptions thereof may be omitted.

[Plasma Processing Apparatus]

Figure 2:
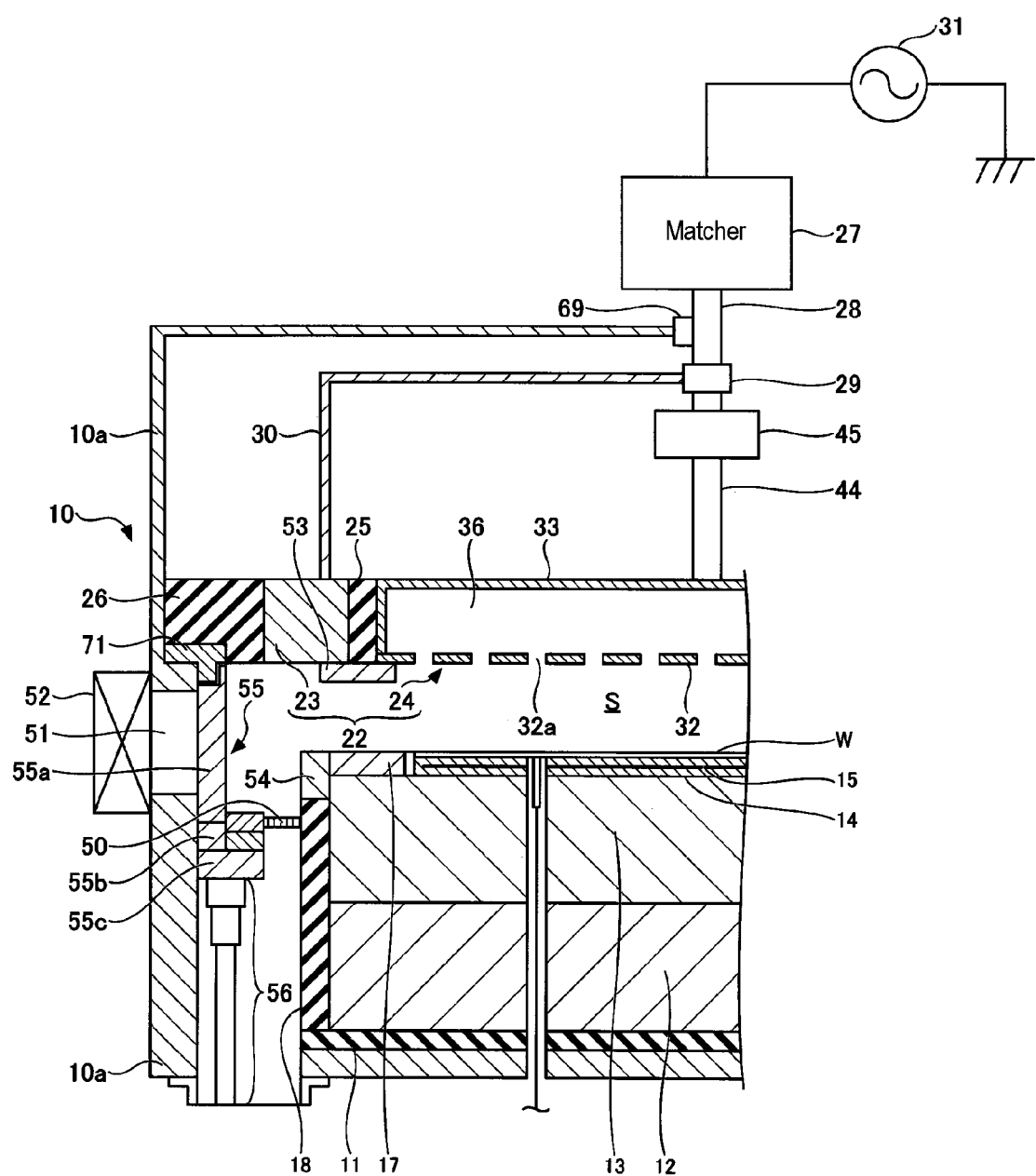
FIG. 2 is an enlarged cross-sectional view illustrating a schematic configuration of an upper electrode and its periphery in FIG. 1.

A plasma processing apparatus 1 according to an embodiment will be described with reference to FIG. 1. FIG. 1 is a schematic cross-sectional view illustrating an example of the plasma processing apparatus 1 according to the embodiment. FIG. 2 is an enlarged cross-sectional view illustrating a schematic configuration of an upper electrode and its periphery in FIG. 1.

In FIG. 1, the plasma processing apparatus 1 is configured as a capacitively coupled parallel plate plasma etching apparatus, and includes, for example, a cylindrical chamber (a processing chamber) 10 made of aluminum, the surface of which is subjected to alumite treatment (anodized), to form a processing space in which a substrate is processed.

The chamber 10 is grounded. In the bottom portion of the chamber 10, a columnar support plate 12 is disposed via an insulating plate 11 made of ceramic or the like, and a substrate support 13 made of, for example, aluminum or the like is disposed on the support plate 12. The substrate support 13 has a configuration that functions as a lower electrode, and a substrate W to be etched (e.g., a semiconductor wafer) is placed thereon.

An electrostatic chuck (ESC) 14 configured to clamp a substrate W by an electrostatic attraction is disposed on the top surface of the substrate support 13. The electrostatic chuck 14 includes an electrode plate 15, which is made of a conductive film, and a pair of insulating layers, which are made of a dielectric, such as $Y_2O_3$, $Al_2O_3$, or $Al_N$, and between which the electrode plate 15 is sandwiched, and a DC power supply 16 is electrically connected to the electrode plate 15 via a connection terminal. The electrostatic chuck 14 clamps a substrate W by Coulomb force or Johnson-Rahbek force generated by a DC voltage applied by the DC power supply 16.

An edge ring 17, which is made of, for example, silicon (Si), is disposed on the peripheral top surface of the substrate support 13 in order to improve etching uniformity, and a cover ring 54 is disposed around the edge ring 17 in order to protect the side portion of the edge ring 17. The side surfaces of the substrate support 13 and the support plate 12 are covered with a cylindrical member 18 made of, for example, quartz ($SiO_2$).

Inside the support plate 12, for example, a coolant chamber 19 extending in the circumferential direction is disposed. A coolant having a predetermined temperature (e.g., cooling water) is circulated and supplied to the coolant chamber 19 from an external chiller unit (not illustrated) via pipes 20a and 20b. The coolant chamber 19 controls the temperature for processing the substrate W on the substrate support 13 by the temperature of the coolant. In addition, by supplying a heat transfer gas (e.g., helium (He) gas) from a heat transfer gas supply mechanism (not illustrated) between the top surface of the electrostatic chuck 14 and the rear surface of the substrate W through a gas supply line 21, heat transfer between the substrate W and the substrate support 13 is efficiently and uniformly controlled.

Above the substrate support 13, an upper electrode 22 is disposed in the cylindrical chamber 10 to be parallel to and face the substrate support 13. Here, the space formed between the substrate support 13 and the upper electrode 22 functions as a plasma generation space S (the space inside the processing chamber). The upper electrode 22 includes an annular or donut-shaped outer upper electrode 23, which is disposed to face the substrate support 13 at a predetermined distance, and a disk-shaped inner upper electrode 24 disposed radially inside the outer upper electrode 23 and insulated from the outer upper electrode 23.

As illustrated in FIG. 2, a dielectric 25 made of, for example, quartz, is disposed in the gap between the outer upper electrode 23 and the inner upper electrode 24. In addition, a ceramic body may be disposed in this gap instead of the dielectric body 25 made of quartz. An annular insulating shielding member 26 made of, for example, alumina ($Al_2O_3$) or yttria ($Y_2O_3$) is hermetically disposed between the outer upper electrode 23 and the side wall of the chamber 10.

The outer external upper electrode 23 is preferably made of a low-resistance conductor or semiconductor having low Joule heat, such as silicon. An upper radio frequency power supply 31 is electrically connected to the outer upper electrode 23 via an upper matcher 27, an upper power-feeding rod 28, a connector 29, and a power-feeding cylinder 30. The upper radio frequency power supply 31 outputs a radio frequency voltage of 13.56 MHz or higher, for example, 60 MH. The upper matcher 27 matches a load impedance to the internal (or output) impedance of the upper radio frequency power supply 31. The upper matcher 27 functions such that the output impedance of the upper radio frequency power supply 31 apparently coincides with the load impedance when plasma is generated within the chamber 10. The output terminal of the upper matcher 27 is connected to the upper end of the upper power-feeding rod 28.

The power-feeding cylinder 30 is made of a substantially cylindrical or conical conductive plate (e.g., an aluminum plate or a copper plate), the lower end of the power-feeding cylinder 30 is continuously connected to the outer upper electrode 23 in the circumferential direction, and the upper end of the power-feeding cylinder 30 is electrically connected to the lower end of the upper power-feeding rod 28 via the connector 29. Outside the power-feeding cylinder 30, the side wall of the chamber 10 extends above the height position of the upper electrode 22 to form a cylindrical ground conductor 10a. The upper end of the cylindrical ground conductor 10a is electrically insulated from the upper power-feeding rod 28 by a cylindrical insulating member 69. In this configuration, in a load circuit viewed from the connector 29, the power-feeding cylinder 30, the outer upper electrode 23, and the ground conductor 10a form a coaxial line having the power-feeding cylinder 30 and the outer upper electrode 23 as a waveguide.

The inner upper electrode 24 has a ceiling plate 32 and an electrode support 33. The ceiling plate 32 has a large number of gas vents 32a, and is made of, for example, a semiconductor material such as silicon or silicon carbide (SiC). The electrode support 33 is a conductive material that detachably supports the ceiling plate 32, and is made of, for example, aluminum, the surface of which is subjected to alumite treatment. The ceiling plate 32 is fastened to the electrode support 33 by bolts (not illustrated). The heads of the bolts are protected by an annular shield ring 53 disposed under the ceiling plate 32.

In the ceiling plate 32, each gas vent 32a penetrates the ceiling plate 32. A buffer chamber 36 is formed inside the electrode support 33. A processing gas source 38 supplies a processing gas to the buffer chamber 36 at a desired flow rate. The inner upper electrode 24 supplies the processing gas introduced into the buffer chamber 36 from the processing gas source 38 to the plasma generation space S via the gas vents 32a. Here, the buffer chamber 36 and the gas vents 32a form a shower head.

A gas supply pipe 39 is connected to the buffer chamber 36, and the flow rate of the processing gas supplied to the buffer chamber 36 is controlled by adjusting the flow rate control valve 40 provided in the gas supply pipe 39. In addition, a mass flow controller (MFC) 41 and an opening/closing valve 42 are arranged in the gas supply pipe 39 to adjust the supply of gas from the processing gas source 38.

The upper radio frequency power supply 31 is electrically connected to the electrode support 33 via the upper matcher 27, the upper power-feeding rod 28, the connector 29, and the power-feeding cylinder 44. A variable capacitor 45 capable of variably adjusting the capacitance is disposed in the middle of the upper power-feeding cylinder 44.

An exhaust port 46 is provided in the bottom portion of the chamber 10, and an automatic pressure control valve (hereinafter, referred to as an "APC valve") 48 and a turbo molecular pump (hereinafter, referred to as "TMP") 49 are connected to the exhaust port 46 via an exhaust manifold 47. The APC valve 48 and the TMP 49 cooperate to reduce the pressure of the plasma generation space S in the chamber 10 to a predetermined degree of vacuum. In addition, between the exhaust port 46 and the plasma processing space S, an annular baffle plate 50 having therein a plurality of vent holes is disposed so as to surround the substrate support 13, and the baffle plate 50 prevents plasma leakage from the plasma generation space S to the exhaust port 46.

A substrate transportation opening 51 is provided in the inner wall (the side wall) of the chamber 10, and a gate valve 52 configured to open and close the opening 51 is disposed. On the inner wall (the side wall and upper outer circumference) of the chamber 10, a substantially cylindrical shield member 71 is disposed along the inner wall of the chamber 10.

A substrate W is carried in/carried out by opening/closing the gate valve 52. By blocking the substrate transportation opening 51 and the opening of the shield member 71 by a shutter member 55, the opening 51 in the chamber 10 and the plasma generation space S are blocked. A drive mechanism 56 configured to drive the shutter member 55 is disposed below the shutter member 55. The shutter member 55 is driven up and down by the drive mechanism 56 to open and close the substrate transportation opening 51 and the opening of the shield member 71.

In the plasma processing apparatus 1, a lower radio frequency power supply (a first radio frequency power supply) 59 is electrically connected to the substrate support 13 as a lower electrode via the lower matcher 58. The lower radio frequency power supply 59 outputs a radio frequency voltage having a frequency in the range of 2 to 27 MHz, for example, a radio frequency voltage of 2 MHz. The lower matcher 58 matches a load impedance to the internal (or output) impedance of the lower radio frequency power supply 59. The lower matcher 58 functions such that the internal impedance of the lower radio frequency power supply 59 and the load impedance match in appearance when plasma is generated in the plasma generation space S within the chamber 10. In addition, a separate second lower radio frequency power supply (a second radio frequency power supply) may be connected to the lower electrode. In this case, for example, a radio frequency voltage of 2 MHz is applied as the first radio frequency power supply, and for example, a radio frequency voltage of 13.56 MHz is applied as the second radio frequency power supply.

In the plasma processing apparatus 1, a low-pass filter (LPF) 61 is electrically connected to the inner upper electrode 24 to pass the radio frequency power (2 MHz) from the lower radio frequency power supply 59 to a ground, rather than passing a radio frequency power (60 MHz) from the upper radio frequency power supply 31 to the ground. Meanwhile, a high-pass filter (HPF) 62 configured to pass the radio frequency power from the upper radio frequency power supply 31 to the ground is electrically connected to the substrate support 13.

The controller 2 processes computer-executable commands that cause the plasma processing apparatus 1 to execute various processes such as etching and film formation. The controller 2 may be configured to control each element of the plasma processing apparatus 1. In an embodiment, a part or all of the controller 2 may be included in the plasma processing apparatus 1. The controller 2 is implemented by, for example, a computer. The controller 2 may include, for example, a processing part (a central processing unit (CPU)), a storage part, and a communication part. The processing part may be configured to perform various control operations based on a program stored in the storage part. The storage part may be a non-transitory computer-readable storage medium implemented by a random access memory (RAM), a read only memory (ROM), a hard disk drive (HDD), a solid state drive (SSD), or a combination thereof. The communication unit may be implemented by a communication interface, and may communicate with the plasma processing apparatus 1 via a communication line such as a local area network (LAN).

[Structure Near Shutter Member]

Figure 3:
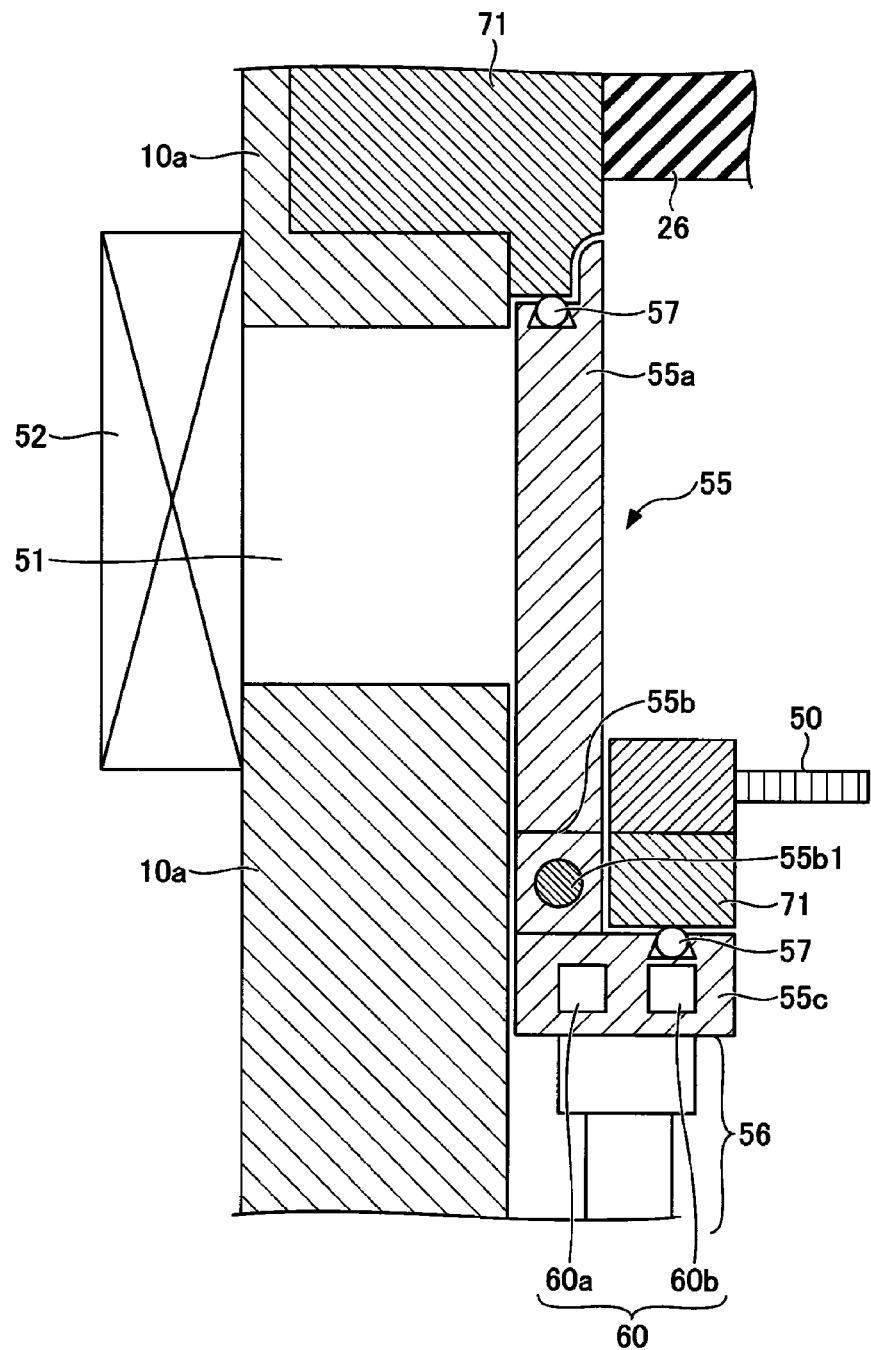
FIG. 3 is an enlarged cross-sectional view illustrating a schematic configuration in the vicinity of a shutter member according to the embodiment.

Next, the configuration near the shutter member 55 in the present embodiment will be described with reference to FIG. 3. FIG. 3 is an enlarged view illustrating an example of the configuration near the shutter member 55 according to the embodiment. The shutter member 55 opens and closes the opening of the shield member 71 and the substrate transportation opening 51, and is formed in a substantially L-shaped cross section by, for example, an aluminum material. The surface of the shutter member 55 is coated with, for example, yttria ($Y_2O_3$) or the like.

As illustrated in the cross-sectional view of FIG. 3, the shutter member 55 includes a valve body 55a, a first ring member 55b, and a second ring member 55c. The valve body 55a opens and closes the substrate transportation opening 51, thereby constituting the outer circumference of the chamber 10. The valve body 55a has an angle of, for example, about 90 degrees from the central axis of the cylindrical chamber 10, and the top surface of the valve body has an arc shape in a plan view. However, the valve body 55a may be a ring-shaped member arranged on the entire circumference of the inner wall of the chamber 10.

The first ring member 55b and the second ring member 55c are connected to the lower portion of the valve body 55a and support the valve body 55a. In the present embodiment, each of the first ring member 55b and the second ring member 55c is separate from the valve body 55a, but may be integrated with the valve body 55a. The first ring member 55b is located directly below the valve body 55a, and the heater 55b1 is embedded in the first ring member.

The heaters 55b1 may have a ring shape, or a plurality of heaters 55b1 may be provided in an arc shape. The heater 55b1 is an example of heating means provided in the first ring member 55b. However, the form of the heating means is not limited to this, and may be in the form of a sheet.

The second ring member 55c is located on the opposite side of the valve body 55a with the first ring member 55b interposed therebetween. The second ring member 55c extends toward the inside of the valve body 55a. Flow paths 60a and 60b are formed inside the second ring member 55c. The flow paths 60a and 60b are also collectively referred to as a flow path 60.

The controller 2 improves the uniformity of the temperature of the inner wall of the chamber 10 by controlling the temperature of the heat transfer medium flowing through the heater 55b1 and the flow path 60. In the present embodiment, both the heater 55b1 as heating means and the flow path 60 as cooling means are provided inside the shutter member 55, but the heater 55b1 may not be provided.

The first ring member 55b and the second ring member 55c are annular members arranged over an entire circumference along the inner wall of the chamber 10. However, the shapes of the first ring member 55b and the second ring member 55c are not limited to the annular members. The first ring member 55b and the second ring member 55c are arranged along the inner wall of the chamber 10, have an arbitrary angle such as 90 degrees with respect to 360 degrees around the central axis of the cylindrical chamber 10, and may be a member having an arc shape when viewed in a plan view.

A conductive elastic member 57 is disposed at the upper end of the valve body 55a. In addition, a conductive elastic member 57 is also disposed on the top surface of the second ring member 55c extending to the plasma generation space S side (the right side in FIG. 3).

The flow path 60 is provided in the second ring member 55c, but the flow path 60 may be provided in the first ring member 55b and/or the valve body 55a. The shutter member 55 and its parts (the valve body 55a, the first ring member 55b, and the second ring member 55c) are examples of members constituting the outer periphery of the chamber 10. For example, the shutter member 55 is provided along the inner wall (the side wall) of the chamber 10 to form the outer circumference of the chamber 10. The members constituting the outer circumference of the chamber 10 may have a cylindrical shape, a ring shape, or an arc shape.

The shutter member 55 closes the substrate transportation opening 51 by being pushed upward by, for example, the drive mechanism 56, and opens the opening 51 by being pulled downward by the drive mechanism 56. In the state in which the opening 51 is closed by the shutter member 55, each of the conductive elastic members 57 arranged at the upper and lower portions of the shutter member 55 comes into contact with the shield member 71, whereby the shutter member 55 is electrically connected to the shield member 71 via the conductive elastic members 57. Since the shield member 71 is in contact with the ground conductor 10a of the chamber 10, the shutter member 55 is grounded via the shield member 71 in the state in which the substrate transportation opening 51 is closed. The number of drive mechanisms 56 is not limited to a single drive mechanism 53. When the shutter member 55 has a ring shape, for example, three or more drive mechanisms 56 may be evenly arranged in the circumferential direction, and the three or more drive mechanisms 56 may move the shutter member 55 up and down in cooperation with each other.

[Flower Path of Shutter Member]

Figure 4A:
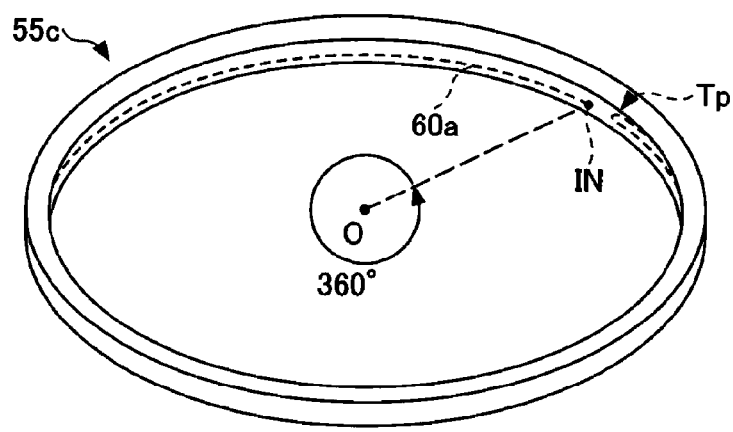
FIGS. 4A and 4B are views illustrating an example of a flow path structure of the shutter member according to the embodiment.
Figure 4B:
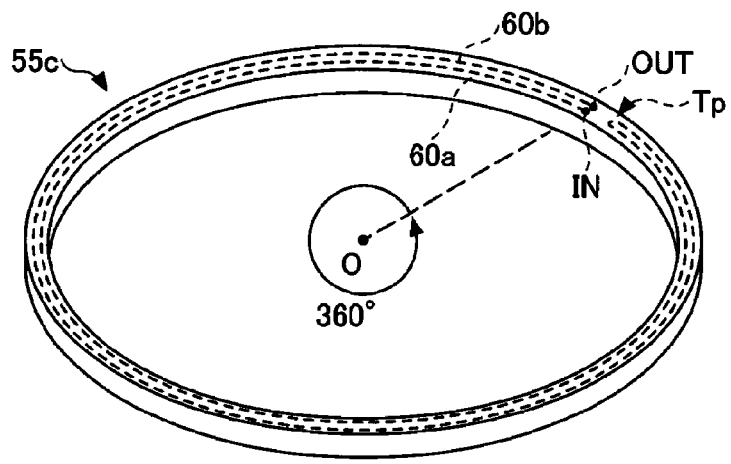
Figure 5B:
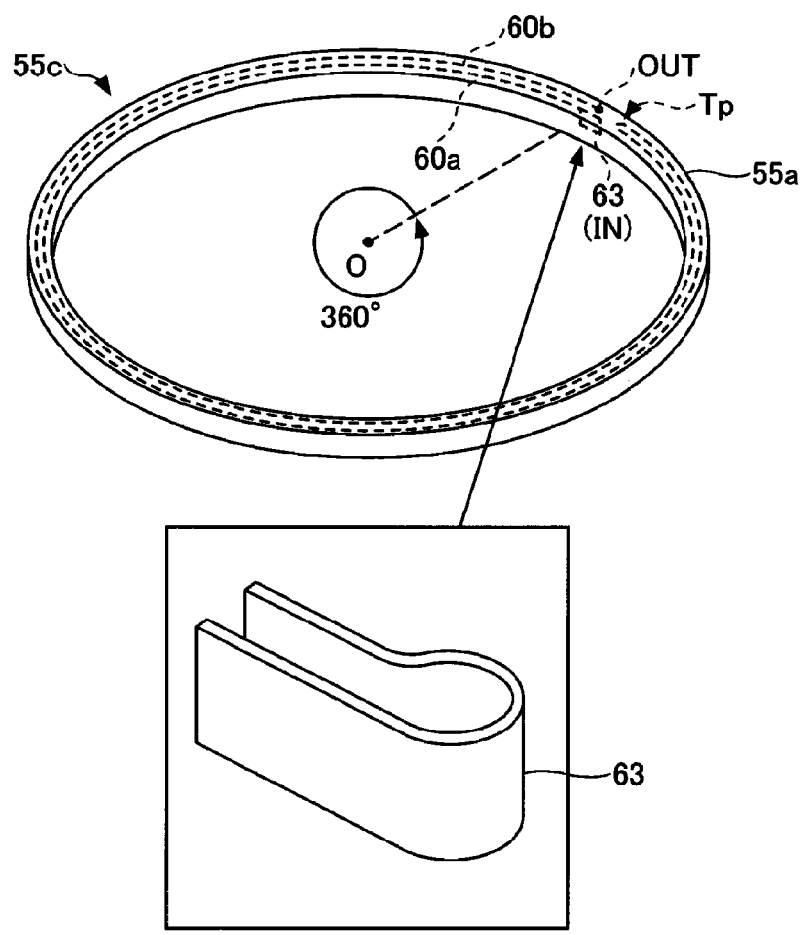

Next, the flow path 60 formed in the shutter member 55 will be described with reference to FIGS. 4A to 5B. FIGS. 4A and 4B are views illustrating an example of a flow path structure formed on the second ring member 55c of the shutter member 55 according to the embodiment. FIGS. 5A and 5B are views illustrating another example of a flow path structure formed on the second ring member 55c of the shutter member according to the embodiment.

FIG. 4A is a top side perspective view of the second ring member 55c, and FIG. 4B is a bottom side perspective view of the second ring member 55c of FIG. 4A, which is turned upside down. In FIGS. 4A and 4B, flow paths 60a and 60b are illustrated by dotted lines. As illustrated in FIGS. 4A and 4B, the flow paths 60a and 60b are formed inside the second ring member 55c in the circumferential direction. The flow path 60 connects an inlet IN and an outlet OUT to one another, and a heat transfer medium flows therein. The flow path 60a is connected to the inlet IN, and the flow path 60b is connected to the outlet OUT. The flow path 60a is the inward path of the flow path 60, and the flow path 60b is the return path of the flow path 60.

As illustrated in FIG. 4B, two holes formed in the bottom surface of the second ring member 55c are the inlet IN of the flow path for the heat transfer medium to flow into the inside of the second ring member 55c and the outlet OUT of the flow path for the heat transfer medium to flow out to the outside of the second ring member 55c.

As illustrated in FIGS. 4A and 4B, a folded-back portion Tp is formed between the inlet IN and the outlet OUT in the flow path 60. The flow paths 60a and 60b are folded back in the folded-back portion Tp and formed in parallel in the circumferential direction, and the inlet IN and the outlet OUT are disposed close to each other. For example, in the present embodiment, the flow paths 60a and 60b are formed around the central axis O of the second ring member 55c at an angle of approximately 360 degrees in the circumferential direction of the second ring member 55c. However, the flow paths 60a and 60b may be formed at a specific angle within 360 degrees in the circumferential direction of the second ring member 55c. For example, the flow paths 60a and 60b may be formed at an angle of 90 degrees in the circumferential direction of the second ring member 55c.

In the present embodiment, each of the flow path 60, the inlet IN, the outlet OUT, and the folded-back portion Tp are provided in the second ring member 55c, but the present disclosure is not limited thereto. As for each of the flow path 60, the inlet IN, the outlet OUT, and the folded-back portion Tp, at least one flow path, at least one inlet, at least one outlet, and at least one folded-back portion may exist.

For example, three of each of the flow path 60, the inlet IN, the outlet OUT, and the folded-back portion Tp may be provided in the second ring member 55c. In this case, the three flow paths 60 may be formed around the central axis O of the second ring member 55c at an angle of about 120 degrees in the circumferential direction, and an inlet IN, an outlet OUT, and a folded-back portion Tp may be provided in each of the three flow paths 60.

A heat transfer medium having a predetermined temperature (e.g., a coolant such as cooling water) is circulated and supplied to the flow path 60 through the pipe connected to the inlet IN and the pipe connected to the outlet OUT (both of which are not illustrated) from the external chiller unit (not illustrated). Thereby, the inner wall of the second ring member 55c and the chamber 10 are controlled to a desired temperature.

The flow path 60 is not limited to being embedded inside the second ring member 55c, and may be formed in a groove shape in the lower portion of the second ring member 55c. In this case, the flow path 60 is defined by the second ring member 55c and the top surface of the drive mechanism 56 provided below the second ring member 55c.

As described above, the flow paths 60a and 60b formed in the second ring member 55c are formed along the side wall of the chamber 10. Two or more flow paths 60a and 60b are arranged in the radial direction of the second ring member 55c. In the present embodiment, as illustrated in FIG. 3, the number of flow paths 60a and 60b arranged in the radial direction of the second ring member 55c is two. However, by providing two folded-back portions Tp, the number of flow paths 60a and 60b arranged in the radial direction of the second ring member 55c may be four. The flow paths 60, the number of which is twice the number of the folded-back portions Tp, are arranged in the radial direction of the second ring member 55c.

As the power of the radio frequency voltage applied to the plasma processing apparatus 1 increases, plasma heat input to the inner wall of the chamber 10 increases. Therefore, the temperature of the inner wall of the chamber 10 tends to be non-uniform. Therefore, a cooling mechanism is required to control the inner wall of the chamber 10 to a target temperature. The member constituting the outer circumference of the chamber 10 according to the present embodiment is an example of the cooling mechanism, and examples thereof include a shutter member 55. A flow path may be provided in the shield member 71, and the shield member 71 may be a member constituting the outer circumference of the chamber 10. The shape of each of the shutter member 55 and the shield member 71 as viewed from above is a ring shape or an arc shape.

The ring shape and the arc shape are likely to have a local low temperature portion. In the present embodiment, the flow path 60 through which the heat transfer medium (e.g., water) flows is formed inside the ring-shaped or arc-shaped shutter member 55. The plasma near the inner wall of the chamber 10 fluctuates depending on the temperature of the inner wall of the chamber 10. Therefore, when the temperature of the members constituting the outer circumference of the chamber 10 is always constant, the temperature of the inner wall of the chamber 10 does not fluctuate. Therefore, by maintaining the temperature of the members constituting the outer circumference of the chamber 10 at a constant level, it is possible to improve the heat uniformity of the inner wall of the chamber 10 and to achieve the uniformity of plasma.

The heat transfer coefficient of a heat transfer medium is roughly proportional to the temperature of the heat transfer medium. In addition, the higher the temperature of the heat transfer medium, the better the heat transfer coefficient. Therefore, when the temperature of the heat transfer medium increases and the length of the flow path, which is provided as a single one, increases, the heat dissipation efficiency increases. Therefore, when one flow path 60 is formed, the longer the flow path 60, the lower the temperature uniformity in the member.

Therefore, the flow path 60 in the shutter member 55 according to the present embodiment forms a flow path pattern in which the flow path is folded back such that the average heat transfer coefficient becomes uniform in the cross section of the flow path 60, so that two flow paths 60a and 60b are arranged side by side. That is, the flow paths 60 in the shutter member 55 have folded-back portions Tp and are configured such that two or more flow paths 60, the number of which is twice the number of folded-back portions Tp, are arranged in parallel to each other. When the cross sections of the flow paths 60 are viewed, one of the flow paths 60a and 60b on the high temperature side and the other flow path on the low temperature side are arranged side by side, and the average value of the temperatures is controlled to be substantially the same no matter where the temperatures are measured in 360 degrees around the center O.

The distance of the flow path 60a from the inlet IN to the folded-back portion Tp and the distance of the flow path 60b from the folded-back portion Tp to the outlet OUT are substantially equal, and the inlet IN and the outlet OUT are arranged close to each other. Preferably, the cross-sectional areas of two or more flow paths 60 when the second ring member 55c is cut in the radial direction are substantially the same (see the cross-sections of the flow paths 60a and 60b in FIG. 3). This makes it possible to enhance the temperature controllability when the heat transfer medium flows through the flow paths 60a and 60b arranged in the radial direction.

The shutter member 55 is supported by a 3-axis drive mechanism 56. The flow rate of the heat transfer medium flowing through the flow path 60 is variably controlled (for example, about 0.4 L/min to 5 L/min) depending on the heat input from the plasma. As a result, not only is the heat transferred to the shutter member 55, but also the generation of local high temperature regions and low temperature regions such as hot spots and cool spots on the inner wall of the chamber 10 is eliminated, and the temperature uniformity of the inner wall of the chamber 10 is improved, so that a uniform plasma environment can be provided.

[Insulating Material]

The heat transfer medium is vertically supplied upward from the inlet IN of the flow path 60a penetrating the bottom surface of the second ring member 55c. In addition, the heat transfer medium is vertically supplied downward from the outlet OUT of the flow path 60b penetrating the bottom surface of the second ring member 55c. Therefore, at the inlet IN and the outlet OUT of the flow paths, the direction of the flow of the heat transfer medium changes or the cross-sectional area of the flow path changes, so that the degree of turbulence increases or the voracity increases. As a result, a temperature deviation such as a cool spot is likely to occur at the inlet IN or the outlet OUT of the flow path. Therefore, as illustrated in FIGS. 5A and 5B, a heat insulating material may be provided inside the inlet IN and the outlet OUT of the flow path. As a result, heat transfer is locally deteriorated at the inlet IN or the outlet OUT, making it difficult for a temperature deviation to occur, and thereby improving temperature uniformity.

FIG. 5A is a top side perspective view of the second ring member 55c, and FIG. 5B is a bottom side perspective view of the second ring member 55c of FIG. 5A, which is turned upside down. In FIGS. 5A and 5B, flow paths 60a and 60b are illustrated by dotted lines. As illustrated in FIGS. 5A and 5B, the flow paths 60a and 60b are formed inside the second ring member 55c in the circumferential direction. The flow path 60a is connected to the inlet IN, the flow path 60b is connected to the outlet OUT, the flow path 60a is the inward path of the flow path 60, and the flow path 60b is the return path of the flow path 60.

A heat insulating material 63 is provided inside the inlet IN connected to the flow path 60a. The heat insulating material 63 is fitted into the interiors of the inlet IN and the flow path 60a connected to the inlet IN, and is hollow so that the heat transfer medium flows inside the heat insulating material 63. In particular, the inlet IN is likely to be a cool spot. Therefore, by providing the heat insulating material 63 at the inlet IN, heat transfer can be locally deteriorated and the temperature uniformity of the inner wall of the chamber 10 can be improved.

In the example of FIGS. 5A and 5B, the heat insulating material 63 is not provided inside the outlet OUT connected to the flow path 60b. However, the present disclosure is not limited to this, and the heat insulating material 63 may be provided to at least one of the inlet IN and the outlet OUT. In particular, it is preferable to place the heat insulating material 63 directly above the inlet IN and directly above the outlet OUT. As a result, the temperature uniformity of the inner wall of the chamber 10 can be improved by locally deteriorating the heat transfer of the portion having a high degree of turbulence.

For the heat insulating material 63, a material such as quartz having a low heat transfer coefficient is used. However, the heat insulating material 63 is not limited to quartz, and may be a material having a low heat transfer coefficient such as glass or resin. This may result in local insulation. As a result, the temperatures of the inlet IN, the outlet OUT, and the like which are likely to be supercooled, approach the average temperature of the ring member. As a result, the temperature uniformity of the inner wall of the chamber 10 can be improved.

[Temperature Measurement Result]

Finally, an example of the temperature measurement result of the second ring member 55c will be described with reference to FIGS. 6A to 6D. FIGS. 6A to 6D are views illustrating examples of measurement results of the temperature of the second ring member 55c of the shutter member 55 according to the embodiment.

The second ring member 55c having the flow paths 60a and 60b illustrated in FIGS. 4A and 5B is "Example 1" shown in FIG. 6C. Examples of the embodiment include "Example 2" illustrated in FIG. 6D in addition to "Example 1" illustrated in FIG. 6C. In the second ring member 55c illustrated in "Example 2" of FIG. 6D, the flow paths 60a connected to the left and the right from the inlet IN are respectively folded back at two folded-back portions Tp1 and Tp2 provided on opposite sides of the inlet IN in the circumferential direction. The two folded-back flow paths 60b are provided in parallel with the two flow paths 60a and are configured to be connected to the outlet OUT.

As described above, in "Example 1", the heat transfer medium flows from the inlet IN through the flow path 60a, flows back at the folded back portion Tp, to flow through the flow path 60b, and reaches the outlet OUT. In "Example 2", the heat transfer medium flows from the inlet IN through the left and right flow paths 60a, flows back at each of the folded-back portions Tp1 and Tp2 to flow through the left and right flow paths 60b, and reaches the outlet OUT.

Figure 6A:
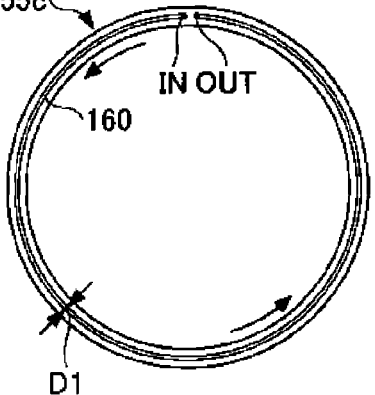
Figure 6B:
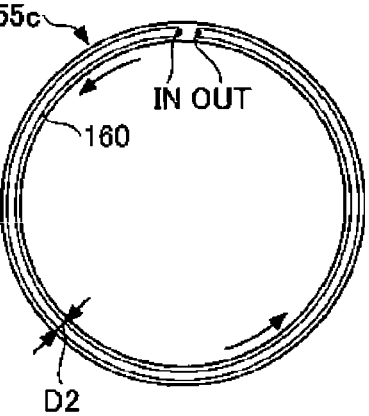

Meanwhile, in "Comparative Example 1" illustrated in FIG. 6A and "Comparative Example 2" illustrated in FIG. 6B, one flow path 160 is formed in the second ring member 55c. The difference between "Comparative Example 1" and "Comparative Example 2" is that the width D2 of the flow path 160 of "Comparative Example 2" is wider than the width D1 of the flow path 160 of "Comparative Example 1".

A simulation was performed in which heat transfer media were caused to flow through the flow paths 160 of FIGS. 6A and 6B and the flow paths 60 of FIGS. 6C and 6D, respectively and the temperature of the second ring member 55c was measured under the following conditions.

<Simulation Conditions>

It was set that there was 3000 W of plasma heat input from the top surface of the shutter member 55. The flow rate of cooling water (the heat transfer medium) was set to 5 L/min. Analysis was performed under a turbulent flow condition (a k-εmodel). The initial temperature of the cooling water (a fixed initial temperature) was set to 25 degrees C. External heat transfer (convection heat transfer/radiation) in which cooling water does not flow was not considered.

The results of calculating temperature deviations (differences between the maximum values and the minimum values) of the second ring member 55c through the simulation are illustrated in FIGS. 6A to 6D. In each of FIGS. 6A to 6D, the temperature deviation between the case where the heat insulating material 63 was not provided at the inlet IN and the outlet OUT and the case where the heat insulating material 63 was provided was obtained.

As a result, in "Example 1" and "Example 2", the temperature deviations of the second ring member 55c were smaller than those in "Comparative Example 1" and "Comparative Example 2", and temperature uniformity was improved. In particular, in "Example 1", the temperature deviation of the second ring member 55c was the smallest, and the temperature uniformity was further higher than that in "Example 2".

The above results were shown in both the case in which the heat insulating material 63 was not provided at the inlet IN and the outlet OUT and the case in which the heat insulating material 63 was provided. In addition, when the heat insulating material 63 was provided, the temperature deviation of the second ring member 55c was smaller than that obtained when the heat insulating material 63 was not provided, and the temperature uniformity was improved.

As described above, according to the plasma processing apparatus 1 according to the present embodiment, the temperature uniformity of the inner wall of the chamber can be improved by the flow path structure in a member constituting the outer circumference of the chamber 10.

The member constituting the outer circumference of the chamber 10 according to the present embodiment may be at least one of the shutter member 55, the drive mechanism 56, the shield member 71, the upper electrode 22 (the outer upper electrode 23 and the inner upper electrode 24), and the insulating shielding member 26.

No flow path is illustrated in the drive mechanism 56, the shield member 71, the outer upper electrode 23, and the insulating shielding member 26 other than the shutter member 55 which is a member constituting the outer circumference of the chamber 10 according to the present embodiment. However, these members may be provided with a flow path having the same structure as the flow path 60 formed in the shutter member 55, in the circumferential direction. On the outer circumference of the inner upper electrode 24 as well, a flow path having the same structure as the flow path 60 formed in the shutter member 55 may be provided in the circumferential direction. In this case, no flow path is provided on the inner circumference side of the inner upper electrode 24.

The flow path formed in the member constituting the outer circumference of the chamber 10 may be manufactured by a 3D printer. However, the present disclosure is not limited thereto, and electron beam welding (EBW), diffusion bonding such as hot pressing (HP) or hot isostatic processing (HIP), or brazing may be used.

The heat transfer medium flowing through the flow path formed in the member constituting the outer circumference of the chamber 10 is not limited to a medium cooling the member, but may be a heating medium. A temperature control is possible with various temperature zones, such as controlling the temperature with a high-temperature heat transfer medium even when heat input is low as well as when high cooling performance is required.

The plasma processing apparatus of the present disclosure is applicable to any of an atomic layer deposition (ALD) type apparatus, a capacitively coupled plasma (CCP) type apparatus, an inductively coupled plasma (ICP) type apparatus, a radial line slot antenna (RLSA) type apparatus, an electron cyclotron resonance plasma (ECRP) type apparatus, and a helicon wave plasma (HWP) type apparatus.

According to an aspect, the temperature uniformity of the inner wall of the chamber can be improved.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:
a cylindrical chamber defining a processing space in which a substrate is processed; and
a shutter member configured to be driven up and down to open and close a substrate transportation opening formed in an inner wall of the cylindrical chamber,
wherein the shutter member includes:
a valve body;
a first ring member located directly below the valve body:
a heater embedded in the first ring member;
a second ring member located directly below the first ring member;
at least one flow path inlet formed inside the second ring and configured to allow a heat transfer medium to flow in therethrough;
at least one flow path outlet formed inside the second ring and configured to allow the heat transfer medium to flow out therethrough;
at least one flow path connecting the flow path inlet and the flow path outlet to one another inside the second ring to allow the heat transfer medium to flow therethrough; and
a folded-back portion formed in each of the at least one flow path,
wherein a flow direction of the heat transfer medium in a flow path portion before the folded-back portion in a circumferential direction of the flow path is opposite of a flow direction of the heat transfer medium in a flow path portion after the folded-back portion in the circumferential direction of the flow path, and
wherein the flow path inlet and the flow path outlet are located close to each other.

2. The plasma processing apparatus of claim 1, wherein the flow path is formed in a substantially annular or arc shape corresponding to an inner wall of the cylindrical chamber.

3. The plasma processing apparatus of claim 2, wherein two or more flow paths are arranged in a radial direction of the shutter member.

4. The plasma processing apparatus of claim 3, wherein, when the shutter member is cut in a radial direction, cross-sectional areas of the two or more flow paths are substantially equal to each other.

5. The plasma processing apparatus of claim 3, wherein a distance from the flow path inlet to the folded-back portion is substantially equal to a distance from the folded-back portion to the flow path outlet.

6. The plasma processing apparatus of claim 5, wherein, when the shutter member is cut in a radial direction, cross-sectional areas of the two or more flow paths are substantially equal to each other.

7. The plasma processing apparatus of claim 6, wherein a heat insulating material is provided inside at least one of the flow path inlet and the flow path outlet.

8. The plasma processing apparatus of claim 1, wherein two or more flow paths are arranged in a radial direction of the shutter member.

9. The plasma processing apparatus of claim 1, wherein a distance from the flow path inlet to the folded-back portion is substantially equal to a distance from the folded-back portion to the flow path outlet.

10. The plasma processing apparatus of claim 1, wherein a heat insulating material is provided inside at least one of the flow path inlet and the flow path outlet.

* * * * *